US012706995B2

United States Patent
(12) United States Patent
Zhang

(10) Patent No.: US 12,706,995 B2
(45) Date of Patent: Aug. 11, 2026

(54) LINE CARD, RELATED APPARATUS, AND CONTROL METHOD

(71) Applicant: Honor Device Co., Ltd., Shenzhen (CN)

(72) Inventor: Lixin Zhang, Shenzhen (CN)

(73) Assignee: Honor Device Co., Ltd., Shenzhen (CN)

(*) Notice: Subject to any disclaimer, the term of this patent is extended or adjusted under 35 U.S.C. 154(b) by 382 days.

(21) Appl. No.: 18/293,599

(22) PCT Filed: Sep. 19, 2023

(86) PCT No.: PCT/CN2023/119817
§ 371 (c)(1),
(2) Date: Jan. 30, 2024

(87) PCT Pub. No.: WO2024/131169
PCT Pub. Date: Jun. 27, 2024

(65) Prior Publication Data

US 2025/0112981 A1 Apr. 3, 2025

(30) Foreign Application Priority Data

Dec. 21, 2022 (CN) ......................... 202211644876.0

(51) Int. Cl.
*H04M 1/02* (2006.01)
*H03F 3/21* (2006.01)

(52) U.S. Cl.
CPC ............ *H04M 1/026* (2013.01); *H03F 3/211* (2013.01); *H03F 2200/03* (2013.01); *H03F 2200/451* (2013.01)

(58) Field of Classification Search
CPC ... H04B 5/79; H04B 3/54; H04B 3/56; H04B 1/3877; H04B 5/24; H04B 1/3827;
(Continued)

(56) References Cited

U.S. PATENT DOCUMENTS 5,367,556 A * 11/1994 Marui ................. H04B 1/3877 379/454
6,002,593 A 12/1999 Tohya et al.
(Continued)

FOREIGN PATENT DOCUMENTS

CN 1201363 A 12/1998
CN 102638229 A 8/2012
(Continued)

*Primary Examiner* — Lana N Le
(74) *Attorney, Agent, or Firm* — Leydig, Voit & Mayer, Ltd.

(57) ABSTRACT

Embodiments of this application provide a line card, a control method, and are applied to the field of terminal technologies. The line card includes a battery interface, a voltage conversion module, a plurality of holes, a connection cable, and a speaker; the holes are located between the speaker and the battery interface, two ends of the connection cable are respectively connected to the battery interface and the voltage conversion module, the connection cable runs through a gap between the speaker and a first hole, and the first hole is a hole closest to the speaker among the plurality of holes; the battery interface is configured to connect to a battery; the voltage conversion module is configured to convert a voltage to supply power; and a first current on the connection cable corresponds to a power supply voltage or a power supply current of the voltage conversion module.

11 Claims, 8 Drawing Sheets

(58) Field of Classification Search
CPC ........ H04B 1/1607; H04B 3/548; H04B 3/46; H04B 17/101; H04B 1/3838; H04W 52/0296; H04W 88/02; H04M 1/026; H04M 1/02; H04M 1/0274; H04M 1/0277; H04M 1/03; H05K 2201/09063; H05K 1/0216; H02J 50/70; H02J 7/00; H02J 7/342; H02J 7/865; H02J 7/751; H02J 7/977; H02J 3/32; H02J 7/663
See application file for complete search history.

(56) References Cited

U.S. PATENT DOCUMENTS

| | | | | |
|---|---|---|---|---|
| 9,294,830 | B2 | 3/2016 | Terlizzi | |
| 11,445,310 | B2 | 9/2022 | Budnick et al. | |
| 11,903,122 | B2 | 2/2024 | Huang | |
| 2002/0059008 | A1 | 5/2002 | Wood | |
| 2003/0107440 | A1* | 6/2003 | Miki | H03F 3/211 330/297 |
| 2004/0246050 | A1* | 12/2004 | Kikuchi | H03F 2200/451 330/136 |
| 2012/0256497 | A1* | 10/2012 | Sung | H02J 7/663 |
| 2012/0275072 | A1* | 11/2012 | Chen | H04B 3/54 |
| 2018/0342897 | A1* | 11/2018 | Huang | H04B 5/79 |
| 2022/0329937 | A1 | 10/2022 | Han et al. | |
| 2022/0345552 | A1 | 10/2022 | Wu et al. | |
| 2023/0187714 | A1* | 6/2023 | Sun | H05K 1/0216 |

FOREIGN PATENT DOCUMENTS

| | | | |
|---|---|---|---|
| CN | 204180245 | U | 2/2015 |
| CN | 114173542 | A | 3/2022 |
| CN | 114286258 | A | 4/2022 |
| CN | 115226010 | A | 10/2022 |
| CN | 115347904 | A | 11/2022 |
| CN | 115633111 | A | 1/2023 |
| CN | 115941823 | A | 4/2023 |
| DE | 102021108811 | A1 | 10/2021 |
| EP | 3196551 | A1 | 7/2017 |
| WO | 2020164494 | A1 | 8/2020 |

* cited by examiner

LINE CARD, RELATED APPARATUS, AND CONTROL METHOD

CROSS-REFERENCE TO RELATED APPLICATIONS

This application is a national stage of International Application No. PCT/CN2023/119817, filed on Sep. 19, 2023, which claims priority to Chinese Patent Application No. 202211644876.0, filed on Dec. 21, 2022. The disclosures of both of the aforementioned applications are hereby incorporated by reference in their entireties.

TECHNICAL FIELD

This application relates to the field of terminal technologies, and in particular, to a line card, a related apparatus, and a control method.

BACKGROUND

With the continuous development of technologies, upgrading of electronic devices is accelerating. As an important performance indicator of the electronic devices, audio performance is also a key field of technological development and upgrading.

However, when a terminal device uses a wireless network, noise may occur when a receiver plays audio.

SUMMARY

Embodiments of this application provide a line card, a related apparatus, and a control method. Two ends of a connection cable are respectively connected to a battery and a voltage conversion module, and the connection cable runs through a speaker from below, to suppress a magnetic field generated by a return current of a power amplifier (PA) module. In addition, by regulating a current on the connection cable, magnetic fields generated by return currents of different PAs may be suppressed, thereby reducing wiring of the line card, and reducing space occupation. Moreover, design of a PCB corresponding to one connection cable is easy to implement with low difficulty.

According to a first aspect, an embodiment of this application provides a line card. The line card includes a battery interface, a voltage conversion module (voltage conversion circuit), a plurality of holes, a connection cable, and a speaker; the holes are located between the speaker and the battery interface, two ends of the connection cable are respectively connected to the battery interface and the voltage conversion module, the connection cable runs through a gap between the speaker and a first hole, and the first hole is a hole closest to the speaker among the plurality of holes; the battery interface is configured to connect to a battery, to supply power; the voltage conversion module is configured to convert a voltage to supply power; and a first current on the connection cable corresponds to a power supply voltage or a power supply current of the voltage conversion module when supplying power.

In this way, the connection cable runs through between the speaker and the hole, and an induced magnetic field may be generated to weaken an induced magnetic field generated by a return current. In addition, a current on the connection cable may be regulated, and magnetic fields generated by return currents of different magnitudes may be suppressed, thereby reducing wiring of the line card, and reducing space occupation.

Optionally, the line card further includes: one or more PAs; the battery interface is connected to the voltage conversion module, and the voltage conversion module is connected to the one or more PAs; the voltage conversion module is specifically configured to supply power to the one or more PAs; and the PA is configured to amplify a radio frequency signal.

In this way, this embodiment is applicable to a situation in which the voltage conversion module supplies power to a PA. Interference to the speaker may be reduced when a terminal device amplifies power of a radio frequency signal, thereby reducing noise of the speaker and improving user experience.

Optionally, the voltage conversion module and the one or more PAs are all located on a first side of the speaker, the battery interface is located on a second side of the speaker, and the first side and the second side are two opposite sides centered around the speaker; and the one or more PAs and the speaker are all located on a third side of the voltage conversion module, the battery interface is located on a fourth side of the voltage conversion module, and the third side and the fourth side are two opposite sides centered around the voltage conversion module.

The first side may be a left side, a right side, or the like. This is not limited herein. The third side may be an upper side, a lower side, or the like. This is not limited herein.

For example, the voltage conversion module is located on a left side of the line card, and the one or more PAs are located on a left side of the speaker and located above the voltage conversion module; and the battery interface is located at the bottom of the line card and located on a right side of the speaker.

It may be understood that in the layout, the magnetic field generated by the current on the connection cable may weaken the magnetic fields generated by the return currents of the one or more PAs near the speaker, thereby reducing magnetic interference to the speaker.

Optionally, the line card further includes: a controller; and the controller is configured to control, when the voltage conversion module supplies power, a current value of a first current flowing through the connection cable and a change frequency of the first current, where the current value of the first current corresponds to the power supply voltage or the power supply current of the voltage conversion module when supplying power, and the change frequency of the first current is the same as a change frequency of the power supply voltage or is the same as a change frequency of the power supply current.

In this way, a current on the connection cable may be regulated, and magnetic fields generated by return currents in different power supply statuses may be suppressed, thereby reducing wiring of the line card, and reducing space occupation. It is unnecessary to use a plurality of connection cables, so that design of a PCB is easy to implement with low difficulty.

Optionally, the one or more PAs include a first PA and a second PA; the controller is specifically configured to control, when the voltage conversion module supplies power to the first PA, a current value of the first current based on a first correspondence, where the first correspondence is a relationship between the current value of the first current and a power supply voltage of the first PA or is a relationship between the current value of the first current and a power supply current of the first PA; and the controller is specifically configured to control, when the voltage conversion module supplies power to the second PA, a current value of the first current based on a second correspondence, where the second correspondence is a relationship between the current value of the first current and a power supply voltage of the second PA or is a relationship between the current value of the first current and a power supply current of the second PA.

The first PA may be a PA configured to amplify a GSM signal, a PA configured to amplify a 4G signal, a PA configured to amplify a 5G signal, a PA configured to amplify a Wi-Fi signal, or the like. This is not limited in this embodiment of this application. The second PA may be a PA configured to amplify a 5G signal, a PA configured to amplify a Wi-Fi signal, a PA configured to amplify a GSM signal, or the like. This is not limited in this embodiment of this application.

Optionally, the voltage conversion module includes: a first pin, a second pin, and a third pin; and the first pin is configured to connect to the battery interface, to perform voltage conversion; and the second pin is configured to connect to the battery interface through the connection cable, and the third pin is configured to connect to one PA of the one or more PAs.

In this way, when the voltage conversion module is supplying power to other modules, an induced magnetic field is generated through the connection cable, to weaken an induced magnetic field generated by a return current, thereby reducing interference to the speaker.

Optionally, the first pin and the second pin are a same pin.

In this way, two connection paths share one pin, so that a quantity of used pins may be reduced, thereby reducing changes to the voltage conversion module.

Optionally, the voltage conversion module further includes: a fourth pin; and the third pin is specifically configured to connect to a first PA, the fourth pin is configured to connect to a second PA, and the first PA is different from the second PA.

In this way, the voltage conversion module may supply power to both the first PA and the second PA. When power is supplied to the first PA or the second PA, an induced magnetic field is generated through the connection cable, to weaken an induced magnetic field generated by a return current, thereby reducing interference to the speaker.

Optionally, a partial connection cable of the connection cable that runs through the gap between the speaker and the first hole is a metal wire, and there is a first preset distance between the metal wire and the speaker.

In this way, the metal wire may be disposed near the speaker, so that a second induced magnetic field generated in the metal wire may weaken a first induced magnetic field generated by the return current as much as possible, and disposing the metal wire and the speaker in parallel can further play a role in enabling the magnitude of the second induced magnetic field to be close to the magnitude of the first induced magnetic field as much as possible, to suppress interference from the first induced magnetic field to the speaker.

Optionally, a partial connection cable of the connection cable that runs through the gap between the speaker and the first hole is a metal coil, and there is a second preset distance between the metal coil and the speaker.

In this way, the metal coil may be disposed near the speaker, so that a second induced magnetic field generated in the metal coil may weaken a first induced magnetic field generated by the return current as much as possible, and disposing the metal coil and the speaker in parallel can further play a role in enabling the magnitude of the second induced magnetic field to be close to the magnitude of the first induced magnetic field as much as possible, to suppress interference from the first induced magnetic field to the speaker.

According to a second aspect, an embodiment of this application provides a terminal device. The terminal device includes: a mobile phone, a tablet computer, a palmtop computer, a notebook computer, a mobile internet device (MID), a wearable device, a virtual reality (VR) device, an augmented reality (AR) device, a wireless terminal in industrial control, a wireless terminal in self-driving, a wireless terminal in a remote medical surgery, a wireless terminal in a smart grid, a wireless terminal in transportation safety, a wireless terminal in a smart city, a wireless terminal in a smart home, a cellular phone, a cordless phone, a session initiation protocol (SIP) phone, a wireless local loop (WLL) station, a personal digital assistant (PDA), a handheld device and a computing device with a wireless communication function, another processing device, a vehicle-mounted device, or a wearable device connected to a wireless modem, a terminal device in a 5G network, or a terminal device in a future evolved public land mobile communication network (PLMN), or the like.

The terminal device includes a battery, and the line card according to the first aspect, where the battery is configured to supply power to the line card through the battery interface.

For beneficial effects of the terminal device provided in the second aspect and all possible designs of the second aspect, refer to beneficial effects brought by the first aspect and all possible apparatuses of the first aspect. Details are not described herein again.

According to a third aspect, an embodiment of this application provides a control method, applied to the terminal device according to the second aspect, where the method includes:

receiving, by the terminal device, first scheduling information; controlling, in response to the first scheduling information when the voltage conversion module is controlled to supply power to a first PA, a current value of the first current based on a first correspondence, where the change frequency of the first current is the same as a change frequency of a power supply voltage of the first PA or is the same as a change frequency of a power supply current of the first PA, and the first correspondence is a relationship between the current value of the first current and the power supply voltage of the first PA or is a relationship between the current value of the first current and the power supply current of the first PA; and receiving, by the terminal device, second scheduling information; and controlling, in response to the second scheduling information when the voltage conversion module is controlled to supply power to a second PA, a current value of the first current based on a second correspondence, where the change frequency of the first current is the same as a change frequency of a power supply voltage of the second PA or is the same as a change frequency of a power supply current of the second PA, and the second correspondence is a relationship between the current value of the first current and the power supply voltage of the second PA or is a relationship between the current value of the first current and the power supply current of the second PA.

Optionally, the first correspondence is obtained through a test of a spectrum analyzer.

For beneficial effects brought by the control method provided in the third aspect and the possible designs of the third aspect, refer to beneficial effects brought by the apparatus provided in the first aspect and the possible designs of the first aspect. Details are not described herein again.

DESCRIPTION OF EMBODIMENTS

Figure 1:
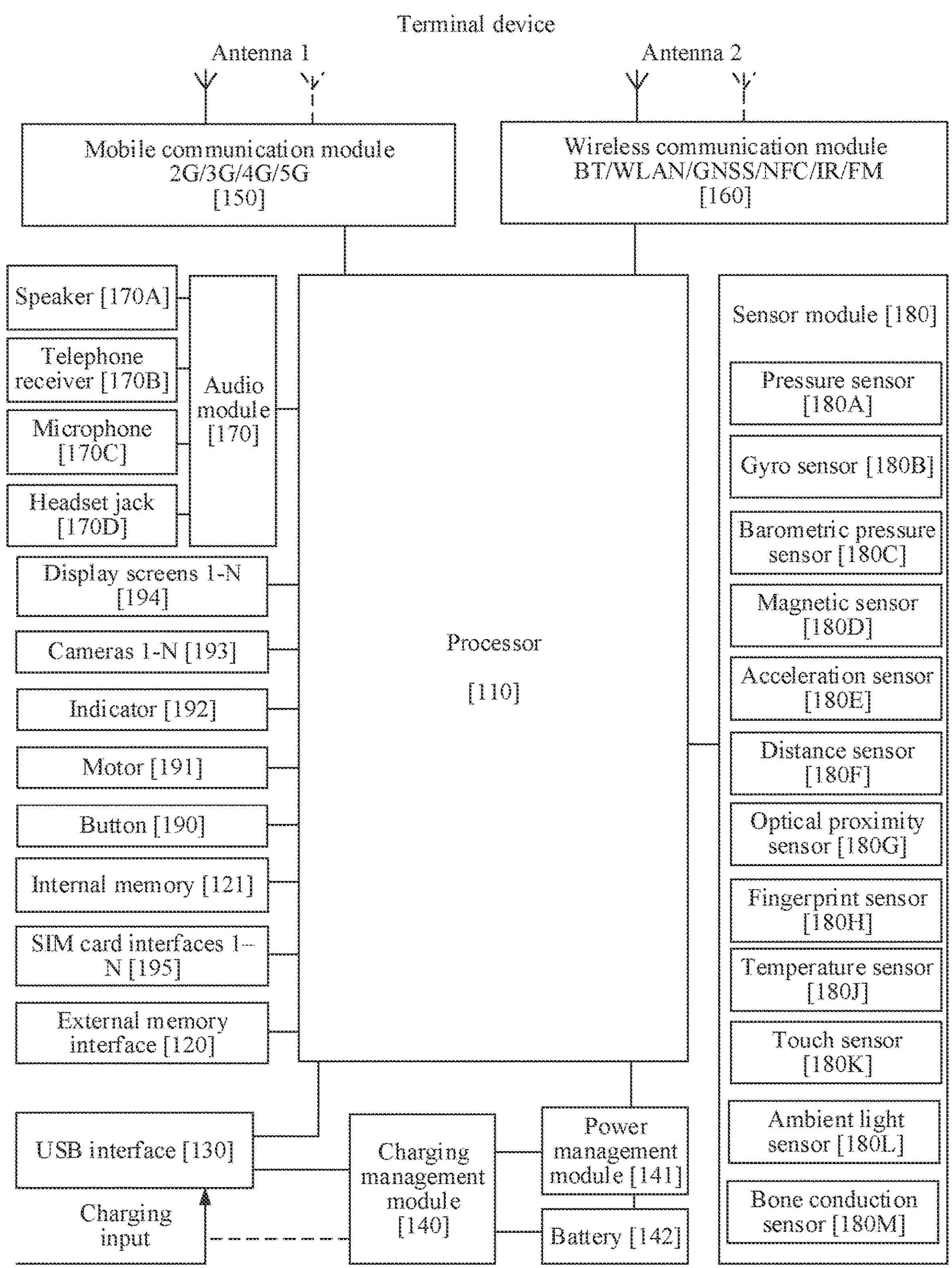
FIG. 1 is a schematic structural diagram of a hardware system of a terminal device according to an embodiment of this application.

To clearly describe the technical solutions in embodiments of this application, in embodiments of this application, terms such as "first" and "second" are used to distinguish between same items or similar items with basically the same functions and effects. For example, a first chip and a second chip are merely used to distinguish different chips, and are not intended to limit a sequence thereof. A person skilled in the art may understand that the terms "first", "second", and the like do not limit a quantity and an execution order, and the terms "first". "second", and the like are not limited to be necessarily different.

It should be noted that the term "example", "for example", or the like in embodiments of this application is used to represent giving an example, an illustration, or a description. Any embodiment or design solution described as "example" or "for example" in this application should not be construed as more preferred or advantageous than other embodiments or design solutions. Exactly, use of the term such as "example" or "for example" is intended to present a related concept in a specific manner.

In embodiments of this application, "at least one" means one or more, and "a plurality of" means two or more. "And/or" describes an association relationship between associated objects and represents that three relationships may exist. For example, A and/or B may represent the following three cases: only A exists, both A and B exist, and only B exists, where A and B may be singular or plural. The character "/" usually indicates that associated objects are in an "or" relationship. "At least one of the following items" or a similar expression means any combination of these items, including a single item or any combination of a plurality of items. For example, at least one of a, b, or c may represent: a, b, c, a-b, a-c, b-c, or a-b-c, where a, b, and c may be single or multiple.

In addition, in embodiments of this application, position terms such as "upper" and "lower" may include, but not limited to a position being defined relative to an illustrative position of a component in the accompanying drawings. It should be understood that these direction terms are relative concepts and are used for relative description and clarification, and may vary accordingly depending on a position change of a component in the accompanying drawings.

A terminal device of embodiments of this application may alternatively be an electronic device in any form. For example, the electronic device may include a handheld device or an in-vehicle device having an image processing function, or the like. For example, some electronic devices are: a mobile phone, a tablet computer, a palmtop computer, a notebook computer, a mobile internet device (MID), a wearable device, a virtual reality (VR) device, an augmented reality (AR) device, a wireless terminal in industrial control, a wireless terminal in self-driving, a wireless terminal in a remote medical surgery, a wireless terminal in a smart grid, a wireless terminal in transportation safety, a wireless terminal in a smart city, a wireless terminal in a smart home, a cellular phone, a cordless phone, a session initiation protocol (SIP) phone, a wireless local loop (WLL) station, a personal digital assistant (PDA), a handheld device and a computing device with a wireless communication function, another processing device, a vehicle-mounted device, or a wearable device connected to a wireless modem, a terminal device in a 5G network, or a terminal device in a future evolved public land mobile communication network (PLMN), or the like. This is not limited in embodiments of this application.

By way of example and not limitation, in embodiments of this application, the electronic device may alternatively be a wearable device. The wearable device may also be referred to as a wearable smart device, and is a generic term for wearable devices such as glasses, gloves, watches, clothing, and shoes that are intelligently designed and developed from daily wear by using wearable technologies. A wearable device is a portable device that can be worn directly on the body or integrated into the clothing or accessories of a user. The wearable device is not merely a hardware device, but can implement powerful functions through software support, data exchange, and cloud interaction. In a broad sense, the wearable smart device includes a full-featured and large-size device that can implement all or some of functions without relying on a smartphone, for example a smart watch or smart glasses, and a device that focuses only on a specific type of application function and needs to be used together with another device such as a smartphone, for example, various types of smart bands and smart jewelry that monitor physical signs.

In addition, in embodiments of this application, the electronic device may alternatively be a terminal device in an internet of things (IoT) system. The IoT is an important part of future information technology development. A main technical feature of the IoT is to connect an object to a network by using a communication technology, to implement an intelligent network with a man-machine interconnection and an object interconnection.

In embodiments of this application, the electronic device may also be referred to as a terminal device, a user equipment (UE), a mobile station (MS), a mobile terminal (MT), an access terminal, a subscriber unit, a subscriber station, a mobile station, a mobile console, a remote station, a remote terminal, a mobile device, a user terminal, a terminal, a wireless communication device, a user agent, a user apparatus, or the like.

In embodiments of this application, the electronic device or each network device includes a hardware layer, an operating system layer running over the hardware layer, and an application layer running over the operating system layer. The hardware layer includes hardware such as a central processing unit (CPU), a memory management unit (MMU), and an internal memory (also referred to as a main memory). The operating system may be any one or more computer operating systems that implement service processing through a process, for example, a Linux operating system, a Unix operating system, an Android operating system, an iOS operating system, or a windows operating system. The application layer includes applications such as a browser, an address book, word processing software, and instant messaging software.

For example, FIG. 1 is a schematic structural diagram of a terminal device.

The terminal device may include a processor 110, an external memory interface 120, an internal memory 121, a universal serial bus (USB) interface 130, a charging management module 140, a power management unit 141, a battery 142, an antenna 1, an antenna 2, a mobile communication module 150, a wireless communication module 160, an audio module 170, a speaker 170A, a telephone receiver 170B, a microphone 170C, a headset jack 170D, a sensor module 180, a key 190, a motor 191, an indicator 192, a camera 193, a display screen 194, a subscriber identification module (SIM) card interface 195, and the like. The sensor module 180 may include a pressure sensor 180A, a gyro sensor 180B, a barometric pressure sensor 180C, a magnetic sensor 180D, an acceleration sensor 180E, a distance sensor 180F, an optical proximity sensor 180G, a fingerprint sensor 180H, a temperature sensor 180J, a touch sensor 180K, an ambient light sensor 180L, a bone conduction sensor 180M, and the like.

It may be understood that the structure shown in this embodiment of the present disclosure does not constitute a specific limitation on the terminal device. In some other embodiments of this application, the terminal device may include more or fewer components than those shown in the figure, or some components may be combined, or some components may be split, or a different component deployment may be used. The components in the figure may be implemented by hardware, software, or a combination of software and hardware.

The processor 110 may include one or more processing units. For example, the processor 110 may include an application processor (AP), a modem processor, a graphics processing unit (GPU), an image signal processor (ISP), a controller, a video codec, a digital signal processor (DSP), a baseband processor, a neural-network processing unit (NPU), and/or the like. Different processing units may be separate components, or may be integrated into one or more processors.

The controller may generate an operation control signal based on an instruction operation code and a timing signal, to complete control on instruction fetching and instruction execution.

A memory configured to store instructions and data may be further disposed in the processor 110. In some embodiments, the memory in the processor 110 is a cache. The memory may store instructions or data recently used or cyclically used by the processor 110. If the processor 110 needs to use the instructions or the data again, the processor may directly invoke the instructions or the data from the foregoing memory. Repeated access is avoided, and waiting time of the processor 110 is reduced, thereby improving system efficiency.

In some embodiments, the processor 110 may include one or more interfaces. The interface may include an inter-integrated circuit (I2C) interface, an inter-integrated circuit sound (I2S) interface, a pulse code modulation (PCM) interface, a universal asynchronous receiver/transmitter (UART) interface, a mobile industry processor interface (MIPI), a general-purpose input/output (GPIO) interface, a subscriber identity module (SIM) interface, a universal serial bus (USB) interface, and/or the like.

It may be understood that the interface connection relationship between the modules shown in this embodiment of the present disclosure is merely an example for description, and does not constitute a limitation on the structure of the terminal device. In some other embodiments of this application, the terminal device may alternatively use an interface connection manner different from that in the foregoing embodiment, or use a combination of a plurality of interface connection manners.

The terminal device implements a display function by using the GPU, the display screen 194, the application processor, and the like. The GPU is a microprocessor for image processing and connects the display screen 194 to the application processor. The GPU is configured to perform mathematical and geometric calculation for graphics rendering. The processor 110 may include one or more GPUs, and the GPU executes program instructions to generate or change display information.

The terminal device may implement a photographing function by using the ISP, the camera 193, the video codec, the GPU, the display screen 194, the application processor, and the like.

The external memory interface 120 may be configured to connect to an external memory card such as a Micro SD card, to expand a storage capacity of the terminal device. The external storage card communicates with the processor 110 by using the external memory interface 120, to implement a data storage function, for example, store files such as music and a video into the external memory card.

The internal memory 121 may be configured to store computer executable program code, where the executable program code includes instructions. The internal memory 121 may include a program storage area and a data storage area. The program storage area may store an operating system, an application required by at least one function (such as a voice playing function and an image playing function), and the like. The data storage area may store data (such as audio data and an address book) created during use of the terminal device, and the like. In addition, the internal memory 121 may include a high-speed random access memory, and may further include a non-volatile memory, for example, at least one magnetic disk storage device, a flash memory device, or a universal flash storage (UFS). The processor 110 executes various functional applications and data processing of the terminal device by running the instructions stored in the internal memory 121 and/or the instructions stored in the memory disposed in the processor. For example, a control method in embodiments of this application may be executed.

It may be understood that the structure shown in this embodiment of this application does not constitute a specific limitation on the terminal device. In some other embodiments of this application, the terminal device may include more or fewer components than those shown in the figure, or some components may be combined, or some components may be split, or a different component deployment may be used. The component shown in the figure may be implemented by hardware, software, or a combination of software and hardware.

Figure 2:
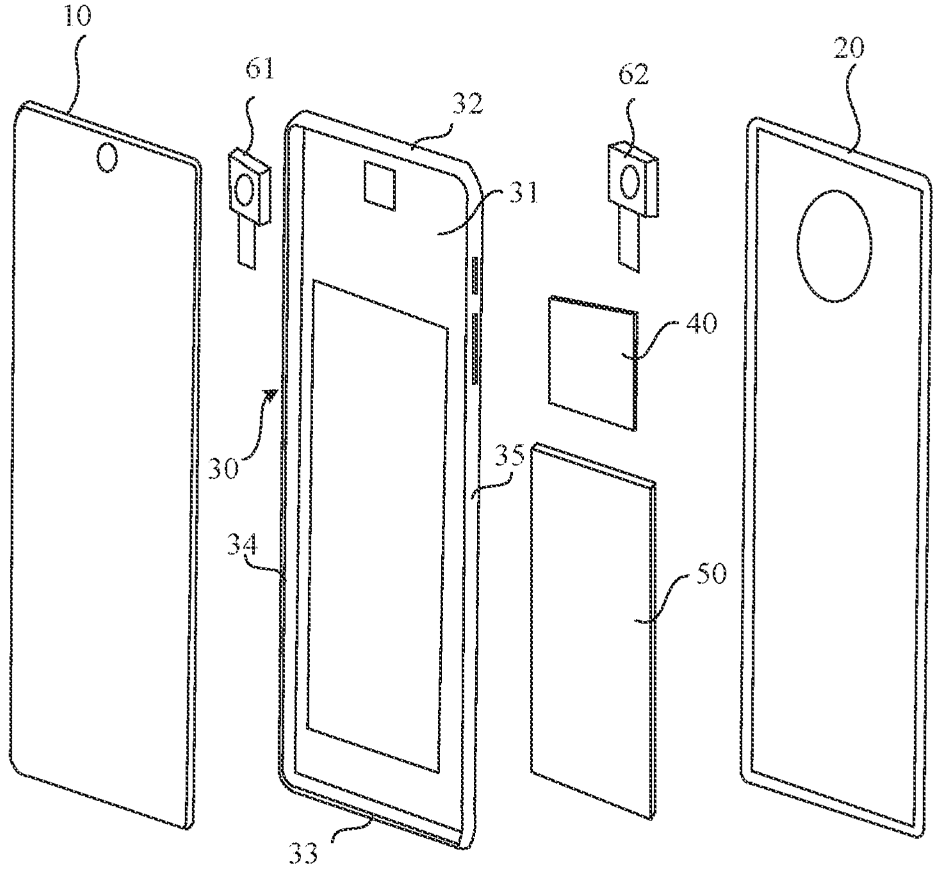
FIG. 2 is a schematic exploded structural diagram of a terminal device according to an embodiment of this application.

For example, FIG. 2 is a schematic exploded structural diagram of a terminal device according to an embodiment of this application. As shown in FIG. 2, the terminal device may include: a display screen 10 and a rear cover 20, and a middle frame 30, a line card 40, and a battery 50 may be disposed between the display screen 10 and the rear cover 80. The line card 40 and the battery 50 may be disposed on the middle frame 30. For example, the line card 40 and the battery 50 are disposed on a surface, facing the rear cover 20, of the middle frame 30. In some other embodiments, the line card 40 and the battery 50 may alternatively be disposed on a surface, facing the display screen 10, of the middle frame 30.

The battery 50 may be connected to the line card 40 by a power management module (not shown) and a charging management module (not shown). The power management module receives an input of the battery 50 and/or the charging management module, and supplies power to a processor, an internal memory, an external memory, the display screen 10, a camera assembly, a communication module, and the like. The power management module may be further configured to monitor a parameter such as a capacity of the battery 50, a cycle count of the battery 50, or a health state (electric leakage and impedance) of the battery 50. In some other embodiments, the power management module may alternatively be disposed in the processor of the line card 40. In some other embodiments, the power management module and the charging management module may alternatively be disposed in a same component.

In this embodiment of this application, the display screen 10 may be an organic light-emitting diode (OLED) display screen, or a liquid crystal display (LCD) screen. It should be understood that the display screen 10 may include a display and a touch device. The display is configured to output display content to a user, and the touch device is configured to receive a touch event inputted by the user on the display screen 10.

The rear cover 20 may be a metal rear cover, a glass rear cover, a plastic rear cover, or a ceramic rear cover. In this embodiment of this application, a material of the rear cover is not limited.

The middle frame 30 may include a metal plate 31 and border frames. The border frames are disposed around an outer edge of the metal plate 31. Generally, the border frames may be rectangular frames. For example, as shown in FIG. 2, the border frames may include a top border frame 32 and a bottom border frame 33 that are disposed opposite to each other, and a left border frame 34 and a right border frame 35 that are disposed opposite to each other between the top border frame 32 and the bottom border frame 33. Therefore, in this embodiment, a side face of the middle frame 30 is a face defined by the top border frame 32, the bottom border frame 33, the left border frame 34, and the right border frame 35.

The metal plate 31 may be an aluminum plate, an aluminum alloy plate, or a magnesium alloy plate. Each border frame may be a metal border frame, a ceramic border frame, or a glass border frame. The metal middle frame 30 may be connected to the border frames through soldering, snap-fit, or integral molding, or the metal middle frame 30 is connected to the border frames through injection molding of a plastic member.

The line card 40 is one of important components of the terminal device, and is a carrier necessary for software implementation. The line card 40 includes: a base board, functional modules mounted on the base board, and other elements mounted on the base board. The functional modules include but are not limited to: a voltage conversion module configured to convert a voltage, a PA module configured to amplify a signal, a camera module configured to perform photographing and videotaping, a display module that may be configured to control display of the display screen, or a module configured to control implementation of other functions (for example, a charging function and an image processing function). A specific function of the functional modules is not limited in embodiments of this application. The other elements include but are not limited to a resistor, a capacitor, an inductor, a memory card, a sensor, a shielding board, or the like. The line card 40 may further include accessories configured to perform fixing, such as a nut and a bolt. The elements may be mounted on the base board through solder joints.

It may be understood that the line card may have protruding positions and/or sunken positions based on different elements. A specific shape of the line card, positions and sizes of the elements, and the like are related to a design layout of the terminal device. This is not specifically limited in embodiments of this application.

Figure 3:
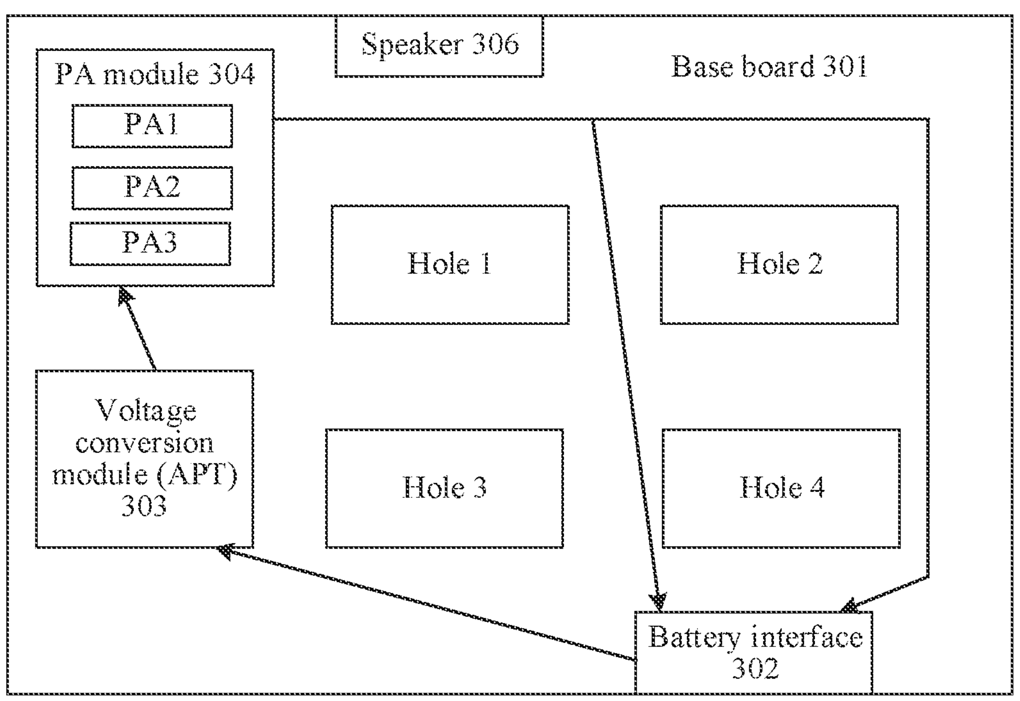
FIG. 3 is a schematic structural diagram of a line card according to an embodiment of this application.

For example, FIG. 3 is a schematic structural diagram of a line card according to an embodiment of this application. As shown in FIG. 3, the line card includes: a base board 301, a battery interface 302, a voltage conversion module (APT) 303, a PA module 304, a hole 1, a hole 2, a hole 3, a hole 4, and a speaker 306.

The base board 301 is an important component of the line card, and the base board 301 is configured to support various elements and various functional modules, and can implement electrical connection or electrical insulation between elements, electrical connection or electrical insulation between functional modules, and electrical connection or electrical insulation between an element and a functional module.

The battery interface 302 is configured to connect to a battery, to supply power to the elements and the functional modules on the line card.

The voltage conversion module 303 is configured to convert a voltage. The voltage conversion module 303 may include a boost circuit and a buck circuit. A voltage output by the battery is increased to a proper voltage through the boost circuit to supply power to the PA module; and a voltage output by the battery is reduced to a proper voltage through the buck circuit to supply power to the PA module.

The voltage conversion module 303 may be an average power tracking voltage conversion module (average power tracking, APT power source), an enhanced power tracking voltage conversion module (enhanced power tracking, EPT power source), an envelope tracking voltage conversion (envelope tracking, ET power source), or the like. A specific structure of the voltage conversion module is not limited in embodiments of this application.

The PA module 304 is configured to amplify a radio frequency signal, to enable an output power of the radio frequency signal output by the terminal device to meet a requirement.

In this embodiment of this application, the PA module includes a plurality of PAs. The PA module may include the following plurality of PAs; a PA configured to amplify a GSM signal, a PA configured to amplify a 4G signal, a PA configured to amplify a 5G signal, a PA configured to amplify a Wi-Fi signal, or the like. A quantity of PAs and the like in the PA module 304 are not limited in embodiments of this application.

Figure 4:
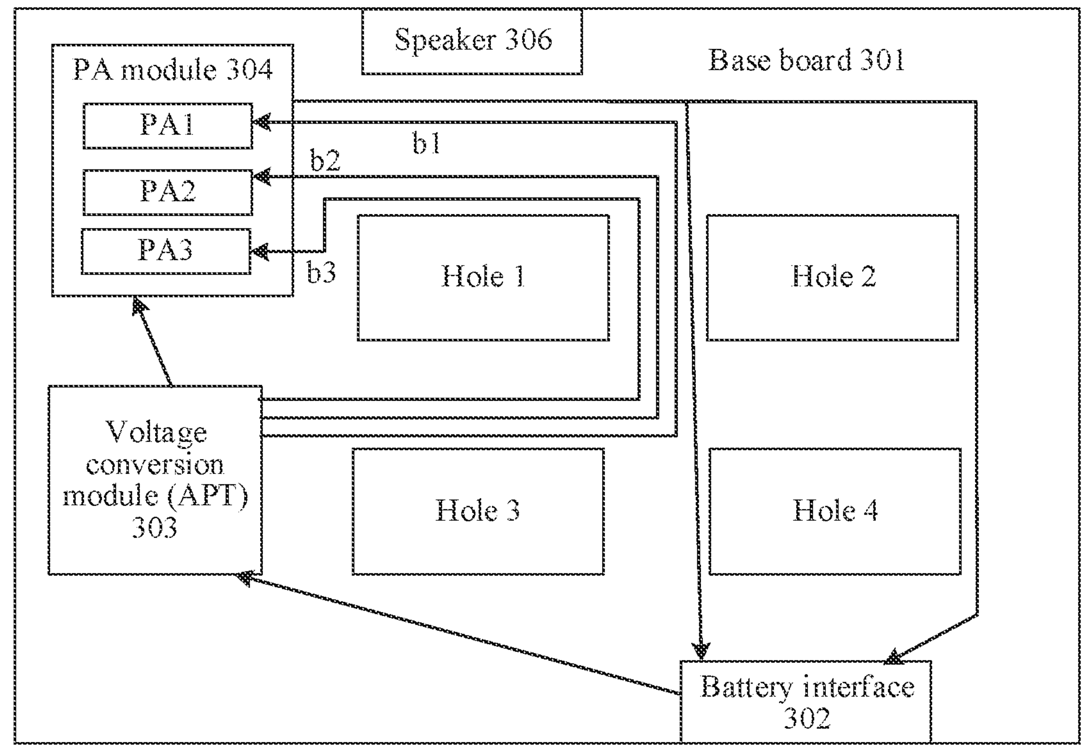
FIG. 4 is a schematic structural diagram of an anti-magnetic interference circuit in a possible design.

It may be understood that the line card may include one or more holes. As shown in FIG. 4, the line card includes four holes, which are respectively a hole 1, a hole 2, a hole 3, and a hole 4. For example, a position in the line card that corresponds to a camera module is provided with a hole, to allow light to pass through to enable a lens in a camera to normally run. The line card may be further provided with a hole, to allow light to pass through to perform mounting, positioning, and the like. A specific function of the hole is not limited in embodiments of this application.

In this embodiment of this application, a shape of the hole may be a circle, a square, or any shape. Shapes of the plurality of holes may be the same or may be different. The shape, a position, a size, and the like of the hole are not limited in embodiments of this application.

The speaker 306 is configured to play audio.

As shown in FIG. 2, the terminal device may further include: a camera assembly and a flash (not shown), and the camera assembly may include a front-facing camera assembly 61 and a rear-facing camera assembly 62. The rear-facing camera assembly 62 and the flash may be disposed on a surface, facing the rear cover 20, of the metal plate 31. The rear cover 20 is provided with a mounting hole in which the flash and the rear-facing camera assembly may be mounted. The front-facing camera assembly 61 may be disposed on a surface, facing the display screen 10, of the metal plate 31, or the front-facing camera assembly 61 may be disposed on a surface, facing the rear cover 20, of the metal plate 31. In some embodiments, the front-facing camera assembly 61 disposed in the terminal device may include one or more cameras, and the rear-facing camera assembly may also include one or more cameras.

It may be understood that the structure shown in this embodiment of this application does not constitute a specific limitation on the terminal device. In some other embodiments of this application, the terminal device may include more or fewer components than those shown in the figure, or some components may be combined, or some components may be split, or a different component deployment may be used. The components shown in the figure may be implemented by hardware, software, or a combination of software and hardware.

With continuous development of technologies, upgrading of electronic devices is accelerating. As an important performance indicator of the electronic devices, audio performance is also a key field of development and upgrading of the technologies.

When the terminal device uses a wireless network, a magnetic coupling problem may occur, consequently resulting in noise when a speaker or a receiver (RCV) plays audio.

It should be noted that, during voice play or standing still, the speaker or the receiver in the terminal device is subject to interference from a surrounding changing magnetic field, and induces a low-frequency alternating current; and when the current reaches a specific magnitude, the speaker or the RCV makes an interference sound, resulting in noise.

For example, as shown in FIG. 3, the battery interface 302 is connected to the voltage conversion module 303, and the voltage conversion module 303 is connected to the PA module 304.

When the PA module works, a current starts from the battery, passes through the battery interface 302, a connection cable between the battery interface 302 and the voltage conversion module 303, the voltage conversion module 303, and a connection cable between the voltage conversion module 303 and the PA module 304, and is injected into the PA module.

It should be noted that, a current always flows in a loop, and any signal in a circuit exists in a form of one closed loop. Specifically, when a current starts from the battery, flows through the battery interface 302 and the voltage conversion module 303, and is injected into the PA module 304, a return current whose direction is opposite to that of the current exists on the line card. The return current starts from the PA module 304 and flows to the battery.

It may be understood that the current transmitted from the battery to the PA module has a visible transmission path, for example, flows along a physical line (for example, along the connection cable between the battery interface 302 and the voltage conversion module 303, or the connection cable between the voltage conversion module 303 and the PA module 304); and the return current usually has an invisible transmission path, and returns with the aid of a ground plane or a power plane in the line card. The transmission path of the return current may also be referred to as a current return path.

Because there is no physical line and the line card is complex in structure (for example, a hole occurs on the line card), the current return path between the PA module and the battery may be different from a transmission path of the current transmitted from the battery to the PA module. In some embodiments, the return current returns to the battery through the RCV from below; resulting in a magnetic coupling problem of the RCV and noise.

For example, the return current may have a transmission path shown by a1 in FIG. 3. As shown in FIG. 3, the return current returns to the battery through the speaker 306 from below; a gap between the hole 1 and the hole 2, a gap between the hole 3 and the hole 4, and the battery interface 302. The return current may alternatively have a transmission path shown by a2 in FIG. 3, and returns to the battery through the speaker 306 from below; a right side of the hole 2, a right side of the hole 4, and the battery interface 302.

When the return current passes through the speaker from below; a first induced magnetic field may be generated around the speaker, enabling an alternating current to be induced in a coil (for example, a moving coil) in the speaker, resulting in noise and degrading user experience.

In a possible design, magnetic coupling interference is suppressed by performing a shunt compensation solution on the PAs in the PA module.

For example, FIG. 4 is a schematic structural diagram of an anti-magnetic interference circuit in a possible design. For example, a PA module 304 includes three PAs, namely a PA1, a PA2, and a PA3; and the PA1, the PA2, and the PA3 respectively correspond to a connection cable b1, a connection cable b2, and a connection cable b3.

As shown in FIG. 4, the anti-magnetic interference circuit includes a voltage conversion module 303, the connection cable b1, the connection cable b2, the connection cable b3, and the PA module 304. Two ends of the connection cable b1 are respectively connected to the PA1 and the voltage conversion module 303. Two ends of the connection cable b2 are respectively connected to the PA2 and the voltage conversion module 303. Two ends of the connection cable b3 are respectively connected to the PA3 and the voltage conversion module 303. The connection cable b1, the connection cable b2, and the connection cable b3 are all located below a speaker 306.

When the terminal device performs signal amplification through the PA1, a magnetic field generated by a return current is weakened through a current on the connection cable b1, thereby alleviating a magnetic coupling problem of the speaker; when the terminal device performs signal amplification through the PA2, a magnetic field generated by a return current is weakened through a current on the connection cable b2, thereby alleviating a magnetic coupling problem of the speaker; and when the terminal device performs signal amplification through the PA3, a magnetic field generated by a return current is weakened through a current on the connection cable b3, thereby alleviating a magnetic coupling problem of the speaker.

However, in a shunt compensation solution performed on the PAs in the PA module, a plurality of connection cables are disposed, occupying a large quantity of wiring spaces and wiring channels. In addition, spatial positions of the line card are limited, design difficulty is large, and it may not be able to accommodate all compensation lines, making it difficult to implement.

In a second possible design, the magnetic interference is suppressed by adding an MOS transistor.

In this way, costs of the line card are increased.

In view of this, an embodiment of this application provides an anti-magnetic interference circuit, to suppress the magnetic interference through one connection cable. Two ends of a connection cable are respectively connected to a battery and a voltage conversion module, and the connection cable runs through a speaker from below, to suppress a magnetic field generated by a return current of a PA module. In addition, by regulating a current on the connection cable, magnetic fields generated by return currents of different PAs may be suppressed, thereby reducing wiring of the line card, and reducing space occupation. In addition, design of a PCB corresponding to one connection cable is low in difficulty, and is easy to implement.

Figure 5:
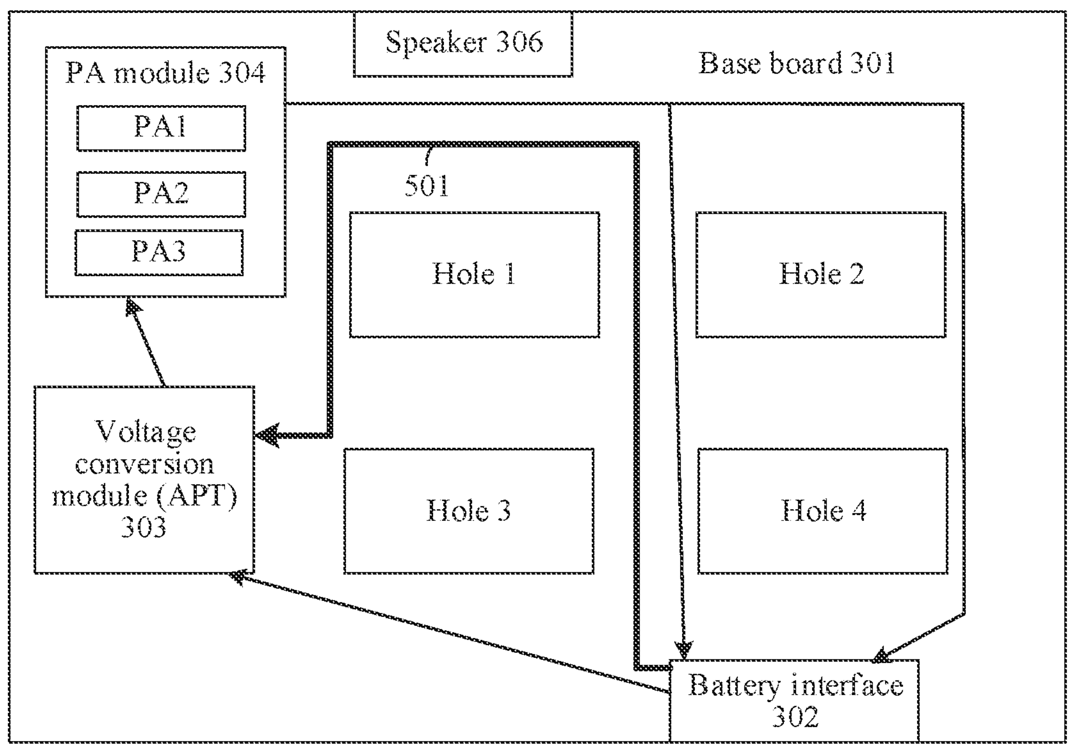
FIG. 5 is a schematic structural diagram of an anti-magnetic interference circuit according to an embodiment of this application.

For example, FIG. 5 is a schematic structural diagram of an anti-magnetic interference circuit according to an embodiment of this application. As shown in FIG. 5, the anti-magnetic interference circuit includes a battery interface 302, a connection cable 501, and a voltage conversion module 303. Two ends of the connection cable 501 are respectively connected to the battery interface 302 and the voltage conversion module 303, and the connection cable 501 runs through a gap between a speaker 306 from below and a hole 1.

When a battery supplies power to a PA module 304, the battery interface 302 transmits a current whose direction is opposite to that of a return current to the voltage conversion module 303 through the connection cable 501, to alleviate a magnetic coupling problem of the speaker.

In this embodiment of this application, the connection cable 501 may be a metal wire or a metal coil. This is not limited in this embodiment of this application.

When a partial connection cable of the connection cable 501 that runs through the gap between the speaker and the first hole is a metal wire, the metal wire is disposed in parallel to the speaker, and a distance between the metal wire and the speaker is less than or equal to a first preset distance.

The metal wire has advantages such as small space occupation and flexible layout, and the distance between the metal wire and the speaker is set to be less than or equal to the first preset distance. Therefore, the metal wire may be disposed near the speaker, so that a second induced magnetic field generated in the metal wire may weaken a first induced magnetic field generated by the return current as much as possible, and disposing the metal wire and the speaker in parallel can further play a role in enabling the magnitude of the second induced magnetic field to be close to the magnitude of the first induced magnetic field as much as possible, to suppress interference from the first induced magnetic field to the speaker.

The first preset distance may be set according to an actual situation or experience. A specific value of the first preset distance is not limited in embodiments of this application.

The partial connection cable of the connection cable 501 that runs through the gap between the speaker and the first hole is a metal coil. It may be understood that compared with the metal wire, the metal coil has a stronger magnetic induction capability. A distance between the metal coil and the speaker is set to be less than or equal to a second preset distance. Therefore, the metal coil may be disposed near the speaker, so that a second induced magnetic field generated in the metal coil may weaken a first induced magnetic field generated by the return current as much as possible, to suppress magnetic interference.

The second preset distance may be set according to an actual situation or experience. A specific value of the second preset distance is not limited in embodiments of this application.

In some embodiments, the terminal device may further regulate, based on a PA use status, a value of a current flowing through on the connection cable 501 to adjust the magnitude of the second induced magnetic field, so that the second induced magnetic field generated by the connection cable 501 may meet the first induced magnetic field generated by the corresponding return current when the PA is used, thereby enhancing a magnetic interference suppression effect.

It may be understood that in FIG. 5, the connection cable 501 runs through a gap between a hole 3 and a hole 4, and a gap between the hole 1 and a hole 2. The connection cable may alternatively run through from a right side of the hole 4, a right side of the hole 2, and a gap between the hole 1 and the speaker. A specific shape, a position, and the like of the connection cable are not limited in embodiments of this application.

In some embodiments, a part of the connection cable 501 that is located near the speaker generates the second induced magnetic field, and the remaining part does not generate the second induced magnetic field. In this way, magnetic interference of the connection cable 501 to other functional modules may be reduced.

In some embodiments, the anti-magnetic interference circuit further includes a controller (not shown in the figure). The controller is configured to control, based on a working status of the PA module, a current value of a current on the connection cable 501 and a frequency of the current.

The controller may be a processor. The processor may be a system on chip (SOC), a micro control unit (MCU), or the like. A specific structure of the controller is not limited in embodiments of this application.

For example, if the controller controls a PA1 in the PA module to perform signal amplification on a first signal, a current value of a current on the connection cable 501 is controlled to be a first value, and a frequency change of the current is controlled to be the same as a frequency change of a power supply voltage of the PA1; if the controller controls a PA2 in the PA module to perform signal amplification on a second signal, a current value of a current on the connection cable 501 is controlled to be a second value, and a frequency change of the current is controlled to be the same as a frequency change of a power supply voltage of the PA2; and if the controller controls a PA3 in the PA module to perform signal amplification on a third signal, a current value of a current on the connection cable 501 is controlled to be a third value, and a frequency change of the current is controlled to be the same as a frequency change of a power supply voltage of the PA3.

In this embodiment of this application, the first value is related to the power supply voltage of the PA1 or related to a power supply current of the PA1. Because the power supply voltage of the PA1 and the power supply current of the PA1 are both related to a transmit power of the first signal, it may also be understood that the first value is related to the transmit power of the first signal. Similarly, the second value is related to the power supply voltage of the PA2 or related to a power supply current of the PA2. Because the power supply voltage of the PA2 and the power supply current of the PA2 are both related to a transmit power of the second signal, it may also be understood that the second value is related to the transmit power of the second signal. The third value is related to the power supply voltage of the PA3 or related to a power supply current of the PA3. Because the power supply voltage of the PA3 and the power supply current of the PA3 are both related to a transmit power of the third signal, it may also be understood that the third value is related to the transmit power of the third signal.

In this way, the anti-magnetic interference circuit may adjust, based on a PA use status, a value of a current on the connection cable, and then adjust strength of the second induced magnetic field, thereby improving a suppression effect of the anti-magnetic interference circuit, improving audio play quality of the speaker, and improving user experience.

It may be understood that compared with the anti-magnetic interference circuit shown in FIG. 4, in the anti-magnetic interference circuit shown in FIG. 5, one connection cable compensates a plurality of PAs, thereby reducing wiring and reducing space occupation. In addition, design of a PCB may be further reduced in difficulty and is easy to implement.

It should be noted that, the position of the connection cable is related to the transmission path of the return current and the position of the speaker. The speaker in the line card shown in FIG. 5 is located on an upper edge of a circuit board, and the return current passes through the speaker from below, so that the connection cable in the anti-magnetic interference circuit is located below the speaker. If the position of the speaker of the line card is changed, the return current passes through from the right side of the speaker, and the connection cable is located on the right side of the speaker.

Figure 6:
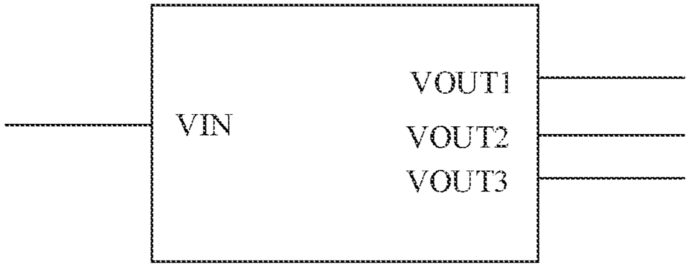
FIG. 6 is a schematic structural diagram of a voltage conversion module according to an embodiment of this application.

For example, FIG. 6 is a schematic structural diagram of a voltage conversion module according to an embodiment of this application. As shown in FIG. 6, the voltage conversion module includes a plurality of pins. The plurality of pins include: a pin (VIN pin) configured to connect to the battery interface, pins (for example, a VOUT1 pin, a VOUT2 pin, and a VOUT3 pin) configured to connect to the PA module, and a pin (GND pin) configured to connect to the ground.

There are at least two connection paths between the VIN pin and the battery interface. One connection path is connected through the connection cable, to weaken the induced magnetic field generated by the return current; and the other connection path is used for input, to perform voltage conversion to supply power to the PA module.

In some embodiments, the foregoing two connection paths share one pin. In some other embodiments, the two connection paths use two pins respectively. A specific connection manner of the voltage conversion module and the battery interface is not limited in embodiments of this application.

The VOUT1 pin, the VOUT2 pin, and the VOUT3 pin are respectively connected to different PAs in the PA module. For example, the VOUT1 pin is connected to the PA configured to amplify a GSM signal, the VOUT2 pin is connected to the PA configured to amplify a 4G signal, and the VOUT3 pin is connected to the PA configured to amplify a 4G signal. The PAs to which the VOUT1 pin, the VOUT2 pin, and the VOUT3 pin are connected are not specifically limited in embodiments of this application. A quantity of pins in the voltage conversion module that are configured to connect to the PA module is not limited in embodiments of this application.

A control method for an anti-magnetic interference circuit is described below with reference to FIG. 7 to FIG. 10.

Figure 7:
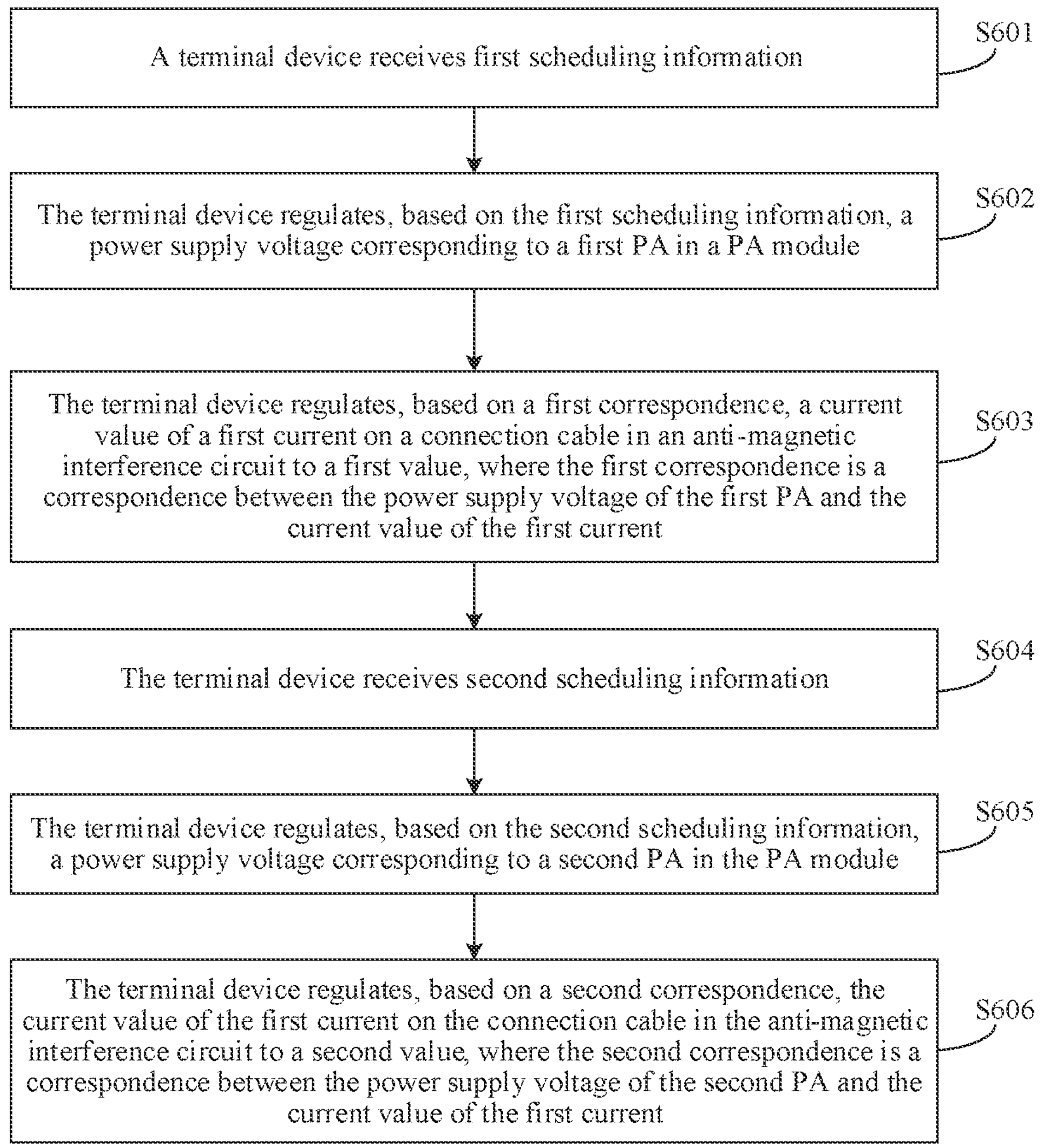
FIG. 7 is a schematic flowchart of a control method according to an embodiment of this application.

For example, FIG. 7 is a schematic flowchart of a control method for an anti-magnetic interference circuit according to an embodiment of this application. As shown in FIG. 7, the control method includes:

S601: A terminal device receives first scheduling information.

The first scheduling information is used to instruct to transmit a first signal. The first scheduling information includes: a frequency, a transmit power, a transmit direction, and the like of the first signal.

S602: The terminal device regulates, based on the first scheduling information, a power supply voltage corresponding to a first PA in a PA module or a power supply current corresponding to the first PA.

It may be understood that the terminal device may regulate, based on the power of the first signal, the power supply voltage corresponding to the first PA or the power supply current corresponding to the first PA.

In this embodiment of this application, the first PA may be a PA configured to amplify a GSM signal, a PA configured to amplify a 4G signal, a PA configured to amplify a 5G signal, a PA configured to amplify a Wi-Fi signal, or the like. This is not limited in this embodiment of this application.

S603: The terminal device regulates, based on a first correspondence, a current value of a first current on a connection cable in an anti-magnetic interference circuit to a first value.

The first correspondence is a relationship between the power supply voltage of the first PA and the current value of the first current.

In this embodiment of this application, the first correspondence may be obtained through a test. For example, assuming that the power supply voltage is a first voltage, a coupling voltage of a speaker is tested through a spectrum analyzer, and a current value of the first current corresponding to a minimum coupling voltage is the first value. This is not limited in this embodiment of this application.

S604: The terminal device receives second scheduling information.

The second scheduling information is used to instruct to transmit a second signal. The second scheduling information includes: a frequency, a power, a direction, and the like of the second signal.

S605: The terminal device regulates, based on the second scheduling information, a power supply voltage corresponding to a second PA in the PA module.

In this embodiment of this application, the second PA is different from the first PA. The second PA may be a PA configured to amplify a 4G signal, a PA configured to amplify a 5G signal, a PA configured to amplify a Wi-Fi signal, a PA configured to amplify a GSM signal, or the like. This is not limited in this embodiment of this application.

S606: The terminal device regulates, based on a second correspondence, the current on the connection cable 501 to a second value.

The second correspondence is a correspondence between the power supply voltage of the second PA and the current on the connection cable 501.

It may be understood that when the terminal device performs signal amplification by using a PA in the PA module, a corresponding current flows through the connection cable in the anti-magnetic interference circuit. In this way, magnetic interference in different signal amplification situations may be suppressed by regulating the current on the connection cable in the anti-magnetic interference circuit.

Figure 8:
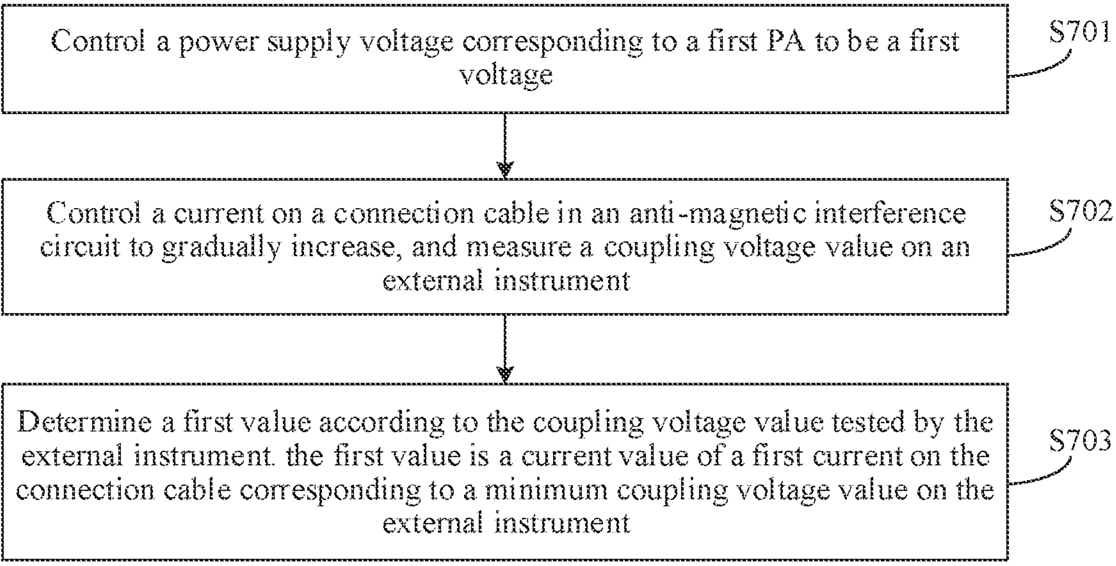
FIG. 8 is a schematic flowchart of testing a relationship between a power supply voltage and a first current according to an embodiment of this application.

A process of testing the correspondence between the power supply voltage of the first PA and the current on the connection cable 501 is described below with reference to FIG. 8.

S701: Control a power supply voltage corresponding to a first PA to be a first voltage.

S702: Control a current on a connection cable in an anti-magnetic interference circuit to gradually increase, and measure a coupling voltage value on an external instrument.

S703: Determine a first value based on the coupling voltage value tested by the external instrument. The first value is a current value of a first current on the connection cable corresponding to a minimum coupling voltage value on the external instrument. The external instrument is located near a speaker.

In this embodiment of this application, the external instrument may be a spectrum analyzer.

In this way, the anti-magnetic interference circuit may weaken a first induced magnetic field of a return current based on the first current, thereby reducing interference from the magnetic field and improving user experience.

Figure 9:
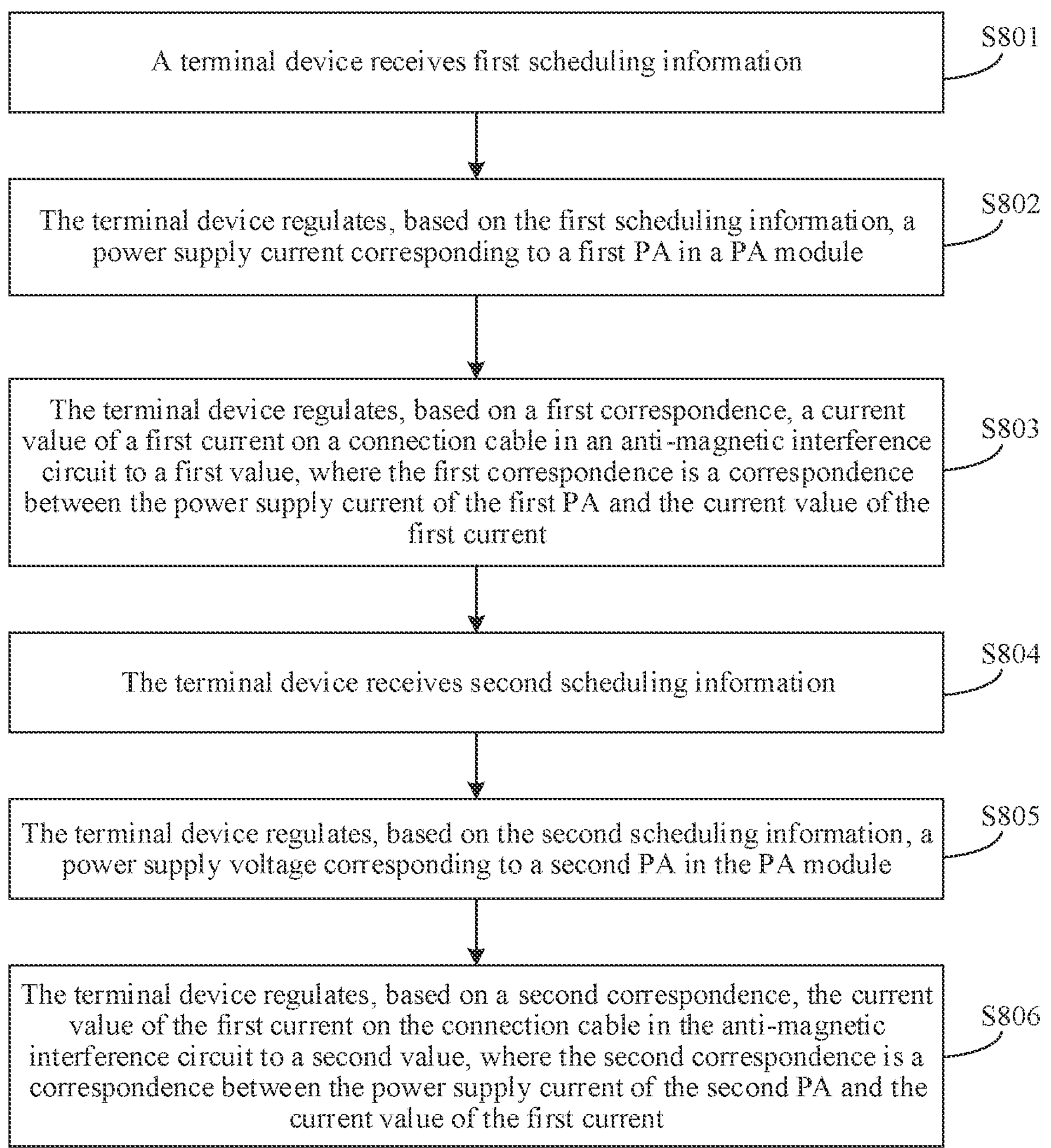
FIG. 9 is a schematic flowchart of a control method according to an embodiment of this application.

For example, FIG. 9 is a schematic flowchart of a control method for an anti-magnetic interference circuit according to an embodiment of this application. As shown in FIG. 8, the control method includes:

S801: A terminal device receives first scheduling information.

The first scheduling information is used to instruct to transmit a first signal. The first scheduling information includes: a frequency, a transmit power, a transmit direction, and the like of the first signal.

S802: The terminal device regulates, based on the first scheduling information, a power supply current corresponding to a first PA in a PA module.

It may be understood that the terminal device may regulate, based on the power of the first signal, the power supply current corresponding to the first PA.

In this embodiment of this application, the first PA may be a PA configured to amplify a GSM signal, a PA configured to amplify a 4G signal, a PA configured to amplify a 5G signal, a PA configured to amplify a Wi-Fi signal, or the like. This is not limited in this embodiment of this application.

S803: The terminal device regulates, based on a first correspondence, a current value of a first current on a connection cable in an anti-magnetic interference circuit to a first value.

The first correspondence is a relationship between the power supply current of the first PA and the current value of the first current.

In this embodiment of this application, the first correspondence may be obtained through a test. For example, assuming that the power supply current is a second current, a coupling voltage of a speaker is tested through a spectrum analyzer, and a current value of the first current corresponding to a minimum coupling voltage is the first value. This is not limited in this embodiment of this application.

S804: The terminal device receives second scheduling information.

The second scheduling information is used to instruct to transmit a second signal. The second scheduling information includes: a frequency, a power, a direction, and the like of the second signal.

S805: The terminal device regulates, based on the second scheduling information, a power supply current corresponding to a second PA in the PA module.

In this embodiment of this application, the second PA is different from the first PA. The second PA may be a PA configured to amplify a 4G signal, a PA configured to amplify a 5G signal, a PA configured to amplify a Wi-Fi signal, a PA configured to amplify a GSM signal, or the like. This is not limited in this embodiment of this application.

S806: The terminal device regulates, based on a second correspondence, the current on the connection cable 501 to a second value.

The second correspondence is a correspondence between the power supply current of the second PA and the current on the connection cable 501.

It may be understood that when the terminal device performs signal amplification by using a PA in the PA module, a corresponding current flows through the connection cable in the anti-magnetic interference circuit. In this way, magnetic interference in different signal amplification situations may be suppressed by regulating the current on the connection cable in the anti-magnetic interference circuit.

Figure 10:
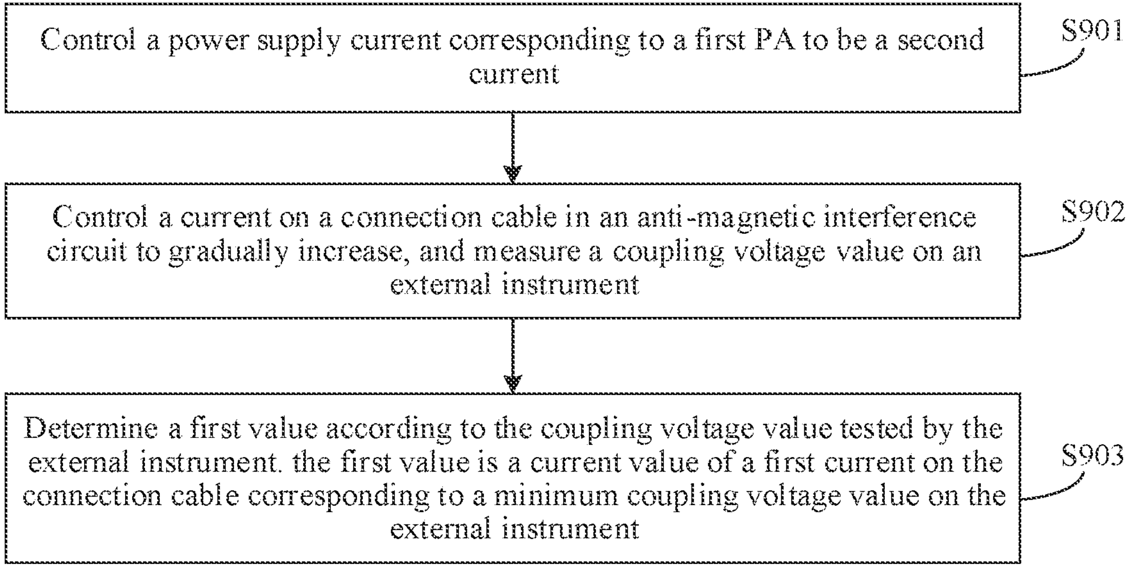
FIG. 10 is a schematic flowchart of testing a relationship between a power supply current and a first current according to an embodiment of this application.

A process of testing the correspondence between the power supply current of the first PA and the current on the connection cable 501 is described below with reference to FIG. 10.

S901: Control a power supply voltage corresponding to a first PA to be a second current.

S902: Control a current on a connection cable in an anti-magnetic interference circuit to gradually increase, and measure a coupling voltage value on an external instrument.

S903: Determine a first current based on the coupling voltage value tested by the external instrument. The first current is a current on the connection cable corresponding to a minimum coupling voltage value on the external instrument. The external instrument is located near a speaker.

In this embodiment of this application, the external instrument may be a spectrum analyzer.

In this way, the anti-magnetic interference circuit may weaken a first induced magnetic field of a return current based on the first current, thereby reducing interference from the magnetic field and improving user experience.

It may be understood that in the foregoing embodiments, the voltage conversion module supplies power to the PA module, and the PA module may alternatively be replaced with another functional module. The functional module to which the voltage conversion module supplies power is not specifically limited in embodiments of this application.

Embodiments of this application provide a terminal device. The terminal device includes a battery, and the line card according to the first aspect, where the battery is configured to supply power to the line card through the battery interface. For a specific structure of the terminal device, reference may be made to related descriptions shown in FIG. 1, which is not be repeated herein.

It should be noted that, user information (including but not limited to user equipment information, user personal information, and the like) and data (including but not limited to data used for analysis, data stored, data displayed, and the like) involved in this application are both authorized by the user or fully authorized by all parties, and collection, use, and processing of related data need to comply with related laws, regulations, and standards of related countries and regions, and are provided with a corresponding operating entry, for the user to accept or reject the authorization.

The foregoing specific implementations further describe in detail the objectives, technical solutions, and beneficial effects of the present disclosure. It should be understood that the foregoing descriptions are merely specific implementations of the present disclosure, but are not intended to limit the protection scope of the present disclosure. Any modification, equivalent replacement, or improvement made based on the technical solutions of the present disclosure should fall within the protection scope of the present disclosure.

What is claimed is:

1. A line card, comprising a battery interface, a voltage conversion circuit, a plurality of holes, a connection cable, a speaker, one or more power amplifiers (PAS), and a controller, wherein:

the plurality of holes are located between the speaker and the battery interface, two ends of the connection cable are respectively connected to the battery interface and the voltage conversion circuit, the connection cable runs through a gap between the speaker and a first hole of the plurality of holes, and the first hole is a hole closest to the speaker among the plurality of holes;

the battery interface is connected to the voltage conversion circuit, and the voltage conversion circuit is connected to the one or more PAS;

the battery interface is configured to connect to a battery, to supply power;

the voltage conversion circuit is configured to convert a voltage to supply power for the one or more PAS;

a first current on the connection cable corresponds to a power supply voltage or a power supply current of the voltage conversion circuit when supplying power;

the one or more PAs are configured to amplify a radio frequency signal; and the controller is configured to control, when the voltage conversion circuit supplies power for the one or more PAs, a current value of a first current, so that the first current reduces a magnetic coupling problem of the speaker.

2. The line card according to claim 1, wherein:

the controller is configured to control, when the voltage conversion circuit supplies power for the one or more PAs, the current value of the first current, so that a second induced magnetic field generated by the first current near the speaker weakens a first induced magnetic field generated by a return current of the one or more PAs near the speaker.

3. The line card according to claim 2, wherein:

the one or more PAs comprise a first PA and a second PA;

the controller is configured to control, when the voltage conversion circuit supplies power to the first PA, a current value of the first current based on a first correspondence, wherein the first correspondence is a relationship between the current value of the first current and a power supply voltage of the first PA or is a relationship between the current value of the first current and a power supply current of the first PA; and the controller is configured to control, when the voltage conversion circuit supplies power to the second PA, a current value of the first current based on a second correspondence, wherein the second correspondence is a relationship between the current value of the first current and a power supply voltage of the second PA or is a relationship between the current value of the first current and a power supply current of the second PA.

4. The line card according to claim 1, wherein:

the voltage conversion circuit and the one or more PAs are all located on a first side of the speaker, the battery interface is located on a second side of the speaker, and the first side and the second side are two opposite sides centered around the speaker; and the one or more PAs and the speaker are all located on a third side of the voltage conversion circuit, the battery interface is located on a fourth side of the voltage conversion circuit, and the third side and the fourth side are two opposite sides centered around the voltage conversion circuit.

5. The line card according to claim 1, wherein:

the controller is configured to control, when the voltage conversion circuit supplies power, a change frequency of the first current flowing through the connection cable, wherein the current value of the first current corresponds to the power supply voltage or the power supply current of the voltage conversion circuit when supplying power, and the change frequency of the first current is the same as a change frequency of the power supply voltage or is the same as a change frequency of the power supply current.

6. The line card according to claim 1, wherein:

the voltage conversion circuit comprises: a first pin, a second pin, and a third pin; and the first pin is configured to connect to the battery interface, to perform voltage conversion, the second pin is configured to connect to the battery interface through the connection cable, and the third pin is configured to connect to one PA of the one or more PAs.

7. The line card according to claim 6, wherein the first pin and the second pin are a same pin.

8. The line card according to claim 6, wherein:

the voltage conversion circuit further comprises a fourth pin; and the third pin is configured to connect to a first PA, the fourth pin is configured to connect to a second PA, and the first PA is different from the second PA.

9. A terminal device, comprising:

a battery; and a line card, wherein the line card comprises a battery interface, a voltage conversion circuit, a plurality of holes, a connection cable, and a speaker;

wherein:

the plurality of holes are located between the speaker and the battery interface, two ends of the connection cable are respectively connected to the battery interface and the voltage conversion circuit, the connection cable runs through a gap between the speaker and a first hole, and the first hole is a hole closest to the speaker among the plurality of holes;

the battery interface is configured to connect to a battery, to supply power;

the voltage conversion circuit is configured to convert a voltage to supply power;

a first current on the connection cable corresponds to a power supply voltage or a power supply current of the voltage conversion circuit when supplying power; and the battery is configured to supply power to the line card through the battery interface.

10. The terminal device according to claim 9, wherein the terminal device is configured to:

receive first scheduling information;

when the voltage conversion circuit is controlled to supply power to a first power amplifier (PA), control, in response to the first scheduling information, a current value of the first current based on a first correspondence, wherein a change frequency of the first current is the same as a change frequency of a power supply voltage of the first PA or is the same as a change frequency of a power supply current of the first PA, and the first correspondence is a relationship between the current value of the first current and the power supply voltage of the first PA or is a relationship between the current value of the first current and the power supply current of the first PA;

receive a second scheduling information; and when the voltage conversion circuit is controlled to supply power to a second PA, control, in response to the second scheduling information, a current value of the first current based on a second correspondence, wherein the change frequency of the first current is the same as a change frequency of a power supply voltage of the second PA or is the same as a change frequency of a power supply current of the second PA, and the second correspondence is a relationship between the current value of the first current and the power supply voltage of the second PA or is a relationship between the current value of the first current and the power supply current of the second PA.

11. The terminal device according to claim 10, wherein the first correspondence is obtained through a test of a spectrum analyzer.

* * * * *